United States Patent
Fang (10) Patent No.: US 8,418,034 B2
(45) Date of Patent: Apr. 9, 2013

(54) SYSTEMS, METHODS, APPARATUS AND COMPUTER PROGRAM PRODUCTS FOR HIGHLY RELIABLE FILE DELIVERY USING COMPOUND AND BRAIDED FEC ENCODING AND DECODING

(75) Inventor: Weimin Fang, Stamford, CT (US)

(73) Assignee: Kencast, Inc., Norwalk, CT (US)

( * ) Notice: Subject to any disclaimer, the term of this patent is extended or adjusted under 35 U.S.C. 154(b) by 970 days.

(21) Appl. No.: 12/365,372

(22) Filed: Feb. 4, 2009

(65) Prior Publication Data

US 2009/0210773 A1    Aug. 20, 2009

Related U.S. Application Data (60) Provisional application No. 61/027,401, filed on Feb. 8, 2008, provisional application No. 61/055,198, filed on May 22, 2008.

(51) Int. Cl.
*H03M 13/00* (2006.01)

(52) U.S. Cl. ........ 714/776; 714/755; 370/231; 370/252; 370/535

(58) Field of Classification Search .............. 714/755, 714/776; 370/231, 252, 535
See application file for complete search history.

(56) References Cited

U.S. PATENT DOCUMENTS

| | | | |
|---|---|---|---|
| 4,009,347 A | 2/1977 | Flemming et al. | 179/15 BS |
| 4,525,833 A | 6/1985 | Cau et al. | 370/99 |
| 4,718,066 A | 1/1988 | Rogard | 371/35 |
| 4,907,277 A | 3/1990 | Callens et al. | 381/46 |
| 5,485,474 A | 1/1996 | Rabin | 371/37.1 |
| 5,594,490 A | 1/1997 | Dawson et al. | 348/6 |
| 5,600,663 A | 2/1997 | Ayanoglu et al. | 371/41 |
| 5,617,541 A | 4/1997 | Albanese et al. | 395/200.13 |
| 5,631,907 A | 5/1997 | Guarneri et al. | 370/474 |
| 5,768,533 A | 6/1998 | Ran | 395/200.77 |
| 5,790,524 A | 8/1998 | Bennett et al. | 370/244 |
| 5,815,514 A | 9/1998 | Gray | 371/42 |
| 5,903,574 A | 5/1999 | Lyons | 371/5.1 |
| 5,959,974 A | 9/1999 | Badt et al. | 370/233 |
| 6,012,159 A | 1/2000 | Fischer et al. | 714/755 |
| 6,031,818 A | 2/2000 | Lo et al. | 370/216 |
| 6,052,819 A | 4/2000 | Barker et al. | 714/776 |
| 6,104,757 A | 8/2000 | Rhee | 375/240 |
| 6,141,788 A | 10/2000 | Rosenberg et al. | 714/774 |
| 6,151,696 A | 11/2000 | Miller et al. | 714/748 |
| 6,189,039 B1 | 2/2001 | Harvey et al. | 709/232 |
| 6,249,810 B1 | 6/2001 | Kiraly | 709/217 |
| 6,272,658 B1 | 8/2001 | Steele et al. | 714/752 |
| 6,289,054 B1 | 9/2001 | Rhee | 375/240.27 |
| 6,307,487 B1 | 10/2001 | Luby | 341/50 |
| 6,317,462 B1 | 11/2001 | Boyce | 375/240.27 |

(Continued)

OTHER PUBLICATIONS

Asmuth et al., "Proceedings of the 1982 Symposium on Security and Privacy," IEEE Computer Society, Apr. 25-26, 1982, p. 156-169, 15 pages, Oakland CA.

(Continued)

*Primary Examiner* — Sam Rizk

(74) *Attorney, Agent, or Firm* — Fitzpatrick, Cella, Harper & Scinto (57) ABSTRACT

Systems, methods, apparatus and computer program products provide highly reliable file delivery using a combination of packet-level FEC on source data packets which are arranged in matrices, where encoding is performed on both rows and columns or on rows, columns and diagonals.

6 Claims, 3 Drawing Sheets

U.S. PATENT DOCUMENTS

| | | |
|---|---|---|
| 6,320,520 B1 | 11/2001 | Luby .................................. 341/50 |
| 6,336,200 B1 | 1/2002 | Wolfgang ........................ 714/752 |
| 6,370,666 B1 | 4/2002 | Lou et al. ........................ 714/751 |
| 6,411,223 B1 | 6/2002 | Haken et al. .................... 341/50 |
| 6,434,191 B1 | 8/2002 | Agrawal et al. ................ 375/227 |
| 6,445,717 B1 | 9/2002 | Gibson et al. .................. 370/473 |
| 6,463,080 B1 | 10/2002 | Wildey ............................ 370/508 |
| 6,486,803 B1 | 11/2002 | Luby et al. ...................... 341/50 |
| 6,496,477 B1 | 12/2002 | Perkins et al. .................. 370/228 |
| 6,498,821 B2 | 12/2002 | Jonas et al. .................... 375/347 |
| 6,526,022 B1 | 2/2003 | Chiu et al. ...................... 370/229 |
| 6,567,929 B1 | 5/2003 | Bhagavath et al. ............. 714/18 |
| 6,567,948 B2 | 5/2003 | Steele et al. .................... 714/746 |
| 6,570,843 B1 | 5/2003 | Wolfgang ........................ 370/216 |
| 6,574,213 B1 | 6/2003 | Anandakumar et al. ....... 370/349 |
| 6,574,795 B1 | 6/2003 | Carr ................................. 725/71 |
| 6,594,798 B1 | 7/2003 | Chou et al. ...................... 714/820 |
| 6,606,723 B2 | 8/2003 | Wolfgang ........................ 714/752 |
| 6,609,223 B1 | 8/2003 | Wolfgang ........................ 714/752 |
| 6,671,807 B1 | 12/2003 | Jaisimha et al. ................ 713/193 |
| 6,693,907 B1 | 2/2004 | Wesley et al. .................. 370/390 |
| 6,701,373 B1 | 3/2004 | Sakazawa et al. ............. 709/232 |
| 6,735,634 B1 | 5/2004 | Geagan, III et al. ........... 709/235 |
| 6,765,889 B1 | 7/2004 | Ludwig ............................ 370/331 |
| 6,782,490 B2 | 8/2004 | Maxemchuk et al. .......... 714/18 |
| 6,804,244 B1 | 10/2004 | Anandakumar et al. .. 370/395.21 |
| 6,868,083 B2 | 3/2005 | Apostolopoulos et al. ... 370/392 |
| 6,937,582 B1 | 8/2005 | Kronestedt |
| 7,024,609 B2 | 4/2006 | Wolfgang et al. .............. 714/748 |
| 7,068,601 B2 | 6/2006 | Abdelilah et al. .............. 370/231 |
| 7,139,243 B2 | 11/2006 | Okumura ........................ 370/248 |
| 7,315,967 B2 | 1/2008 | Azenko et al. .................. 714/704 |
| 7,324,578 B2 | 1/2008 | Kwon et al. .................... 375/135 |
| 7,418,651 B2 | 8/2008 | Luby et al. |
| 7,425,905 B1 | 9/2008 | Oberg .............................. 341/58 |
| 7,516,387 B2 | 4/2009 | Arnold et al. .................. 714/751 |
| 7,533,324 B2 | 5/2009 | Fischer et al. .................. 714/776 |
| 7,739,580 B1 | 6/2010 | Fang et al. ...................... 714/776 |
| 7,796,517 B2 | 9/2010 | Chen et al. ...................... 370/235 |
| 2001/0033611 A1 | 10/2001 | Grimwood et al. ............ 375/219 |
| 2001/0046271 A1 | 11/2001 | Jonas et al. .................... 375/347 |
| 2002/0035730 A1 | 3/2002 | Ollikainen et al. ............. 725/93 |
| 2002/0097678 A1 | 7/2002 | Bisher, Jr. et al. ............. 370/232 |
| 2004/0025186 A1 | 2/2004 | Jennings et al. ................ 725/93 |
| 2004/0170201 A1* | 9/2004 | Kubo et al. ..................... 370/535 |
| 2006/0059409 A1 | 3/2006 | Lee ................................. 714/784 |
| 2006/0253763 A1 | 11/2006 | Oliva et al. ..................... 714/746 |
| 2007/0022361 A1 | 1/2007 | Bauer et al. .................... 714/776 |
| 2008/0002580 A1* | 1/2008 | Kawada et al. ................ 370/231 |
| 2008/0098284 A1 | 4/2008 | Wolfgang et al. .............. 714/776 |
| 2008/0117819 A1 | 5/2008 | Flott et al. ...................... 370/232 |
| 2008/0244001 A1 | 10/2008 | Fang ............................... 709/203 |
| 2008/0285476 A1* | 11/2008 | Rajakarunanayake ........ 370/252 |
| 2008/0298271 A1 | 12/2008 | Morinaga et al. .............. 370/252 |
| 2009/0177948 A1 | 7/2009 | Fischer et al. .................. 714/776 |
| 2009/0193314 A1* | 7/2009 | Melliar-Smith et al. ...... 714/755 |
| 2010/0005178 A1 | 1/2010 | Sindelaru et al. .............. 709/228 |
| 2010/0218074 A1 | 8/2010 | Fang et al. ...................... 714/776 |

OTHER PUBLICATIONS

Karnin et al., "On Secret Sharing Systems," IEEE Transactions on Information Theory, Jan. 1983, vol. IT-29, No. 1, 7 pages.

MacKay, David J.C., "Information Theory, Inference, and Learning Algorithms," Cambridge University Press, 2003, 640 pages.

McAuley, Anthony J, "Reliable Broadband Communication Using A Burst Erasure Correcting Code," SIGCOMM '90 Symposium, Sep. 1990, p. 297-306, 12 pages.

McEliece et al., "On Sharing Secrets and Reed-Solomon Codes," Communications of the ACM, Sep. 1981, vol. 24, 2 pages.

Miller, C Kenneth, "Reliable Multicast Protocols: A Practical View", Local Computer Networks Conference Proceedings, Nov. 1997, p. 369-378, 11 pages.

Rabin, Michael O, "Efficient Dispersal of Information for Security, Load Balancing, and Fault Tolerance," Journal of the Assoc. For Computing Machinery, Apr. 1998, p. 335-348, vol. 36, No. 2, 14 pages.

Rabin, Michael O, "Probabilistic Algorithms in Finite Fields," SIAM J. Comput., May 1980, p. 273-280, vol. 9, No. 2, 5 pages.

Shamir, Adi, "How to Share a Secret," Communications of the ACM, Nov. 1979, p. 612-613, vol. 22, No. 11, 2 pages.

* cited by examiner

SYSTEMS, METHODS, APPARATUS AND COMPUTER PROGRAM PRODUCTS FOR HIGHLY RELIABLE FILE DELIVERY USING COMPOUND AND BRAIDED FEC ENCODING AND DECODING

CROSS REFERENCE TO RELATED APPLICATIONS

This application claims priority to, and the benefit of, U.S. Provisional Patent Application Ser. No. 61/027,401, filed Feb. 8, 2008, and U.S. Provisional Patent Application Ser. No. 61/055,198, filed May 22, 2008, both of which are hereby incorporated by reference in their entirety

BACKGROUND

1. Field

Example aspects of the present invention generally relate to providing reliable transfer of data, and more particularly to correction coding.

2. Related Art

The degradation in the quality of signals over satellite and terrestrial communication links as a result of long transmission delays and/or high-bit error links is a problem which continues to persist. Such transmission impairments make it difficult to broadcast large files to fixed or mobile locations. It is desirable, therefore, to provide a method and system for correction coding to ensure that large data files transmitted using one-way satellite broadcasting and/or terrestrial networks are received error-free despite the various transmission impairments which interfere with the communication signals

BRIEF DESCRIPTION

The example embodiments described herein meet the above-identified needs by providing systems, methods, apparatus and computer program products for highly reliable file delivery using a combination of packet-level FEC on source data packets which are arranged in matrices, where encoding is performed on both rows and columns or on rows, columns and diagonals.

The concept of performing row and column encoding is referred to herein as "compound" encoding and the concept of performing row, column and diagonal encoding is referred to herein as "braided" encoding. As a result of the example compound and braided encoding techniques described herein, the probability of successful delivery of all source data packets increases more than linearly when compared to encoding on columns but not rows, encoding on rows but not columns, or encoding on columns and rows but not diagonals.

In one embodiment of the present invention, a method for encoding a source file to be transmitted to a receiver is provided. The method includes dividing the source file into source packets, dividing the source packets into groups, generating a source packet matrix from the source packets in one of the groups, and calculating Forward Error Correction (FEC) packets for each column of the source packet matrix. The method further performs calculating FEC packets for each row of the source packet matrix and transmitting the source packets in the source packet matrix and the FEC packets for each row and column of the source packet matrix.

In another embodiment of the present invention, a method for reconstructing a source file is provided. The method includes receiving packets, where each packet is at least one of a source packet and an FEC packet and storing each source packet into a corresponding source packet matrix. In addition, each FEC packet is stored. The method further includes determining, for each row of the source packet matrix, whether at least one of the source packets has not been received and can be recovered based, in part, on a status information field of the row, recovering a source packet that has not been received for each row and updating a status information field of a column associated with the recovered packet. In addition, the method includes determining, for each column of the source packet matrix, whether at least one of the source packets has not been received and can be recovered based, in part, on a status information field of the column, and recovering a source packet that has not been received for each column. A status information field of a row associated with the recovered packet is then updated.

Another embodiment of the present invention provides an apparatus for encoding a source file to be transmitted to a receiver including a processor, a memory, an encoder and a transmitter. The processor divides the source file into source packets and divides the source packets into groups. The memory stores a source packet matrix including the source packets in one of the groups. The encoder generates Forward Error Correction (FEC) packets for each column of the source packet matrix and FEC packets for each row of the source packet matrix. The transmitter then transmits the source packet in the source packet matrix and the FEC packets for each row and column of the source packet matrix.

A further embodiment of the present invention provides an apparatus for reconstructing a source file including a receiver, a memory, a processor, and a decoder. The receiver receives packets, where each packet is at least one of a source packet and an FEC packet. The memory stores each source packet into a corresponding source packet matrix and stores each FEC packet. The processor determines, for each row of the source packet matrix, whether at least one of the source packets has not been received and can be recovered based, in part, on a status information field of the row. The decoder, in turn, recovers a source packet that has not been received for each row, and the processor updates a status information field of a column associated with the recovered packet. The processor also determines, for each column of the source packet matrix, whether at least one of the source packets has not been received and can be recovered based, in part, on a status information field of the column. The decoder, in turn, recovers a source packet that has not been received for each column and the decoder updates a status information field of a row associated with the recovered packet.

Another embodiment of the present invention provides a method for encoding a source file to be transmitted to a receiver including dividing the source file into source packets, dividing the source packets into groups, and generating a source packet matrix from the source packets in one of the groups. The method further includes calculating Forward Error Correction (FEC) packets for each column of the source packet matrix, calculating FEC packets for each row of the source packet matrix, calculating FEC packets for each diagonal of the source packet matrix, and transmitting the source packets in the source packet matrix and the FEC packets for each row, column and diagonal of the source packet matrix.

Yet another embodiment of the present invention provides a method for reconstructing a source file, including receiving packets, where each packet is at least one of a source packet and an FEC packet. The method further includes storing each source packet into a corresponding source packet matrix and storing each FEC packet. For each row of the source packet matrix a determination is made whether at least one of the source packets has not been received and can be recovered based, in part, on a status information field of the row. The method further includes recovering a source packet that has not been received for each row and updating a status information field of a column and a diagonal associated with the recovered packet. For each column of the source packet matrix, a determination is made whether at least one of the source packets has not been received and can be recovered based, in part, on a status information field of the column. A source packet that has not been received for each column is recovered and a status information field of a row and a diagonal associated with the recovered packet is updated. For each diagonal of the source packet matrix, a determination is made whether at least one of the source packets has not been received and can be recovered based, in part, on a status information field of the diagonal. A source packet that has not been received for each diagonal is recovered and a status information field of a row and a column associated with the recovered packet is updated.

Another embodiment of the present invention provides an apparatus for encoding a source file to be transmitted to a receiver, including a processor, a memory, an encoder, and a transmitter. The processor divides the source file into source packets and divides the source packets into groups. The memory stores a source packet matrix including the source packets in one of the groups. The encoder generates Forward Error Correction (FEC) packets for each column of the source packet matrix, FEC packets for each row of the source packet matrix, and FEC packets for each diagonal of the source packet matrix. The transmitter, in turn, transmits the source packet in the source packet matrix and the FEC packets for each row, column and diagonal of the source packet matrix.

In another embodiment of the present invention, an apparatus for reconstructing a source file is provided. The apparatus includes a receiver, a memory, a processor, and a decoder. The receiver receives packets, where each packet is at least one of a source packet and an FEC packet. The memory stores each source packet into a corresponding source packet matrix and each FEC packet. The processor determines, for each row of the source packet matrix, whether at least one of the source packets has not been received and can be recovered based, in part, on a status information field of the row. The decoder recovers a source packet that has not been received for each row, and the decoder updates a status information field of a column and a diagonal associated with the recovered packet. The decoder further determines, for each column of the source packet matrix, whether at least one of the source packets has not been received and can be recovered based, in part, on a status information field of the column. The decoder also recovers a source packet that has not been received for each column and the decoder updates a status information field of a row and a diagonal associated with the recovered packet. The decoder also determines, for each diagonal of the source packet matrix, whether at least one of the source packets has not been received and can be recovered based, in part, on a status information field of the diagonal. The decoder further recovers a source packet that has not been received for each diagonal and the decoder updates a status information field of a row and a column associated with the recovered packet.

Further features and advantages of the present invention as well as the structure and operation of various embodiments of the present invention are described in detail below with reference to the accompanying drawings.

BRIEF DESCRIPTION OF THE DRAWINGS

The features and advantages of the present invention will become more apparent from the detailed description set forth below when taken in conjunction with the drawings.

DETAILED DESCRIPTION

Compound FEC

In one example embodiment, a file is divided into packets, where each packet has the same number of bytes, except for the last packet which may have fewer bytes. If the last packet has fewer bytes than the other packets, then stuff bytes (e.g., consisting of 0's) are added to the last packet to increase its size such that it has the same number of bytes (i.e., is the same size) as the other packets.

The resulting packets are arranged into groups of packets where different groups may have different number of packets. Stuff packets (e.g., consisting of 0's) also may be added to a group to increase its packet count.

The following example embodiments are described in terms of a single group. However, it should be understood that other groups are treated the same way.

Figure 1:
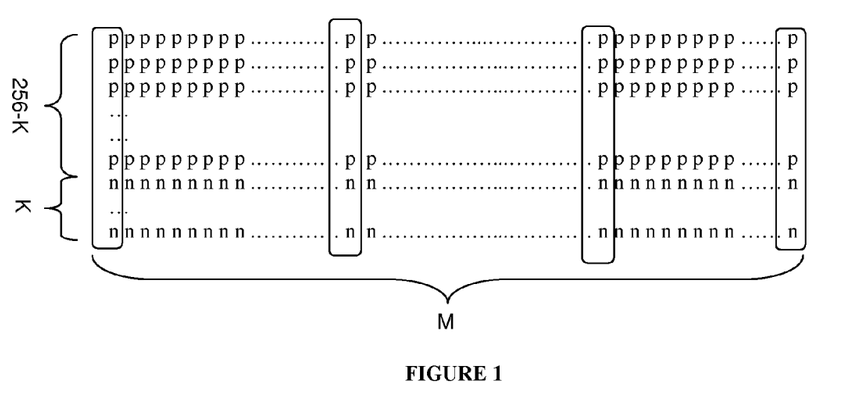
FIGS. 1 and 2 depict an exemplary procedure for encoding data using compound FEC in accordance with an embodiment of the present invention.
Figure 2:
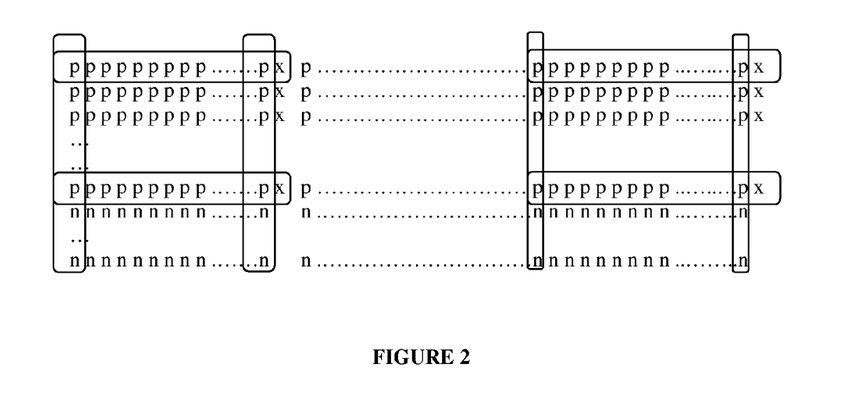

FIGS. 1 and 2 depict the exemplary procedure for encoding data using compound FEC in accordance with an embodiment of the present invention. Referring to FIG. 1, initially, a matrix of packets is formed from file packets. A file has, for example, (256−K)×M packets, where K is a predefined small number (e.g., between 4 to 16). For a 256 GB file, with 1 KB packet size, M could be relatively large (e.g., 1,000,000). In this example a (256−K)×M source packets (p) matrix is created by placing the first packet of a file into matrix position (1, 1), placing the second packet into position (1, 2), and so on until the $M^{th}$ packet in the file is placed into position (1, M). Then, the $(M+1^{st})$ packet is placed into position (2, 1), and so on until the $(M+M)^{th}$ packet is placed into position (2, M). This procedure is continued until all packets in the file are placed into the matrix. The result will be a (256−K) by M source packets matrix as shown in FIG. 1.

Next, K FEC packets (n) are computed for each source packets column (i.e., the vertical boxes shown in FIG. 1). As a result, the arrangement of these (256−K)×M source packets forms a (256−K)×M matrix, where each row has M packets that are consecutive packets in the file, each column of the matrix has (256−K) packets, and K FEC packets are added to each column, as shown in FIG. 1.

Referring now to FIG. 2, one XOR FEC packet (x) is added for every 128 source packets and one XOR FEC packet (x) for the last q source packets on all source packets rows (i.e., the horizontal boxes shown in FIG. 2). Once this is accomplished, the resulting packets ($p_s$, $x_s$, $n_s$) are transmitted. Particularly, first row 1 is transmitted, then row 2, etc., until all rows have been transmitted. Corresponding header information (e.g., sequence number and other info about the packet) is added to each packet when transmitting the packets.

Defining M=128*p+q, where p and q are integers, and 1=<q<=128, for every 128 consecutive source packets in each row, 1 FEC packet, which is an XOR of all these 128 source packets, is added to each row. For the last q source packets in each row, 1 FEC packet which is an XOR of all these q source packets is added, as shown in FIG. 2.

Every 128 packets of the 129 packets (i.e., 128 consecutive source packets in each row plus the 1 XOR FEC packet) can solve the 128 source packets. Every q packets of these (q+1)

packets (i.e., the last q consecutive source packets in each row plus the 1 XOR FEC packet) can solve the last q source packets.

The decoding method is an iterative decoding method that is performed group by group. In this example, all the groups have $(256-K) \times 128$ source packets, except the last group has $(256-K) \times q$ source packets.

In another example embodiment, a group has $(R \times S)$ packets, where R and S are positive integers. These packets are arranged into an $R \times S$ matrix and the $(R \times S)$ packets are referred to as source packets. For each column of the matrix, K FEC packets are added for some positive integer K such that for each column, any R packets of these (R+K) packets (i.e., R source packets plus K added FEC packets) will solve for the R source packets in that column. Similarly, for each row of the matrix, L FEC packets are added for some positive integer L and such that for each row, any S packets of these (S+L) packets (i.e., S source packets plus L added FEC packets) will solve for the S source packets in that row.

The generation of K FEC packets for the R source packets in each column will now be described in detail. In an example embodiment, R+K<=256. As is well known, the numbers 0, 1, ..., 255 (where each of these number is represented by a byte) form a Galois Field GF(256) under the bitwise XOR operation and well known Galois field multiplication as described in N. Jacobson, *Basic Algebra*, W H Freeman, 1985, and F. J. MacWilliams and N. J. A. Sloane, *The Theory of Error-Correcting Codes*, North-Holland Publishing Company, Amsterdam, N. Y., Oxford, 1977, both of which are hereby incorporated by reference in their entirety.

x$y means x to the power of y in this GF(256) and the following Vandermonde matrix is an $R \times (R+K)$ matrix:

| 1 | 1 | 1 | 1 | ... 1 |
|---|---|---|---|---|
| 0 | 1 | 2 | 3 | ... (R + K − 1) |
| 0$2 | 1$2 | 2$2 | 3$2 | ... (R + K − 1)$2 |
| ... | | | | |
| 0$(R − 1) | 1$(R − 1) | 2$(R − 1) | 3$(R − 1) | ... (R + K − 1)$(R − 1) |

This Vandermonde matrix has the property that any of its $R \times R$ sub-matrices is invertible. Now, using only matrix row operations, the above matrix can be changed to $$I G \quad (1)$$

where I is the $R \times R$ identity matrix, and G is $R \times K$ matrix, such that an $R \times (R+K)$ matrix [I G] still has the property that any of its $R \times R$ sub-matrices are invertible. Assuming the size of each packet is B bytes, then every packet can be defined as a vector of B elements in GF(256). The R source packets can be defined as R vectors, which can further be defined as an $R \times B$ matrix, denoted as matrix H. Then $$G^T * H \quad (2)$$

is a $K \times B$ matrix, where $G^T$ is the transpose matrix of G. The resulting $K \times B$ matrix consists of K vectors, each vector having B bytes. These K vectors are the K generated FEC packets and are the same size as the source packets. From the property of [I G], the R source packets can be solved from any R of the (R+K) packets (i.e., R source packets plus K FEC packets).

The generation of L FEC packets for the S source packets in each row is similar. The source packets are transmitted together with the generated FEC packets, for example, from one computer to other computers. Header information (e.g., sequence number and other information about the packet) is added to each packet upon their transmission.

Due to impairments which degrade the signal quality, some packets may be lost during the transmissions. The following is an algorithm running on the receiving devices (e.g., computers) to recover source packets from received packets. In one example embodiment, the recovery procedure is done group by group.

In the pseudo code that follows:

"N" denotes an $R \times S$ matrix where the matrix elements are 0 if the corresponding source packet is received and 1 if the corresponding source packet is missing;

"U" denotes an "R" elements vector where the $i^{th}$ element of U includes a variable "m" to denote the total missing source packets in the $i^{th}$ row, and a variable "t" to denote the total number of packets (i.e., source packets and FEC packets) received in the $i^{th}$ row; and "V" denotes an "S" elements vector where the $j^{th}$ element of V includes a variable "m" to denote the total missing source packets in the $j^{th}$ column, and variable "t" to denote the total number of packets (i.e., source packets and FEC packets) received in the $j^{th}$ column.

"Missing" is a variable used to denote the total number of missing source packets in the $(R \times S)$ source packets.

An example recovery algorithm will now be described in detail. For simplicity only one group is processed in this example, however, it will be understood that other groups can be processed in the same way.

```
int flag;
flag = 1;
while (1)
{
    //for row processing
    for (i=0; i<R; i++)
    {
        if (U[i].m == 0) //this row is skipped
            continue;
        if (U[i].t < S)
            continue;
        //Since this row has received at least S packets
        solve the missing source packets in this row
        flag = 1;
        Missing -= U[i].m;
        U[i].m = 0; //next time, this row will be skipped
        for (j=0; j<S; j++)
        {
            if (N[i][j] == 1)
            {
                N[i][j] = 0;
                V[j].m--; //update column status information
                V[j].t++; //update column status information
            }
        }
    }
    if (flag == 0) break;
    //for column processing
    for (j=0; j<S; j++)
    {
        if (V[j].m == 0) //this column is skipped
            continue;
        if (V[j].t < R)
            continue;
        //Since this column has received at least R packets
        solve the missing source packets in this column
        flag = 0;
        Missing -= V[j].m;
        V[j].m = 0; //next time, this column will be skipped
        for (i=0; i<R; i++)
        {
            if (N[i][j] == 1)
            {
                N[i][j] = 0;
                U[i].m--; //update row status information
                U[i].t++; //update row status information
```

```
            }
          }
        }
        if (flag == 1)
          break;
    }
    if (Missing == 0)
      all the source packets in this group are recovered
    else
      some source packets cannot be recovered by this decoding method
```

Under certain conditions, some source packets may not be capable of being recovered by processing the received packets using the above decoding algorithm. Other data recovery techniques can be used in addition to the above algorithm, however, to recover the remaining lost packets based on certain run-time information and user configurations.

In an example embodiment, the recovery technique uses Gaussian elimination method to recover lost symbols, using linear equations with unknowns. FEC packets can be represented as linear equations, where the source packets to be recovered are the unknowns.

The FEC packets generated in each row or column also can be generated by other FEC methods, for example the LDPC (Low Density Parity Check) method. In an example embodiment, the corresponding decoding method is a modified version of the above iterative decoding method.

Figure 7:
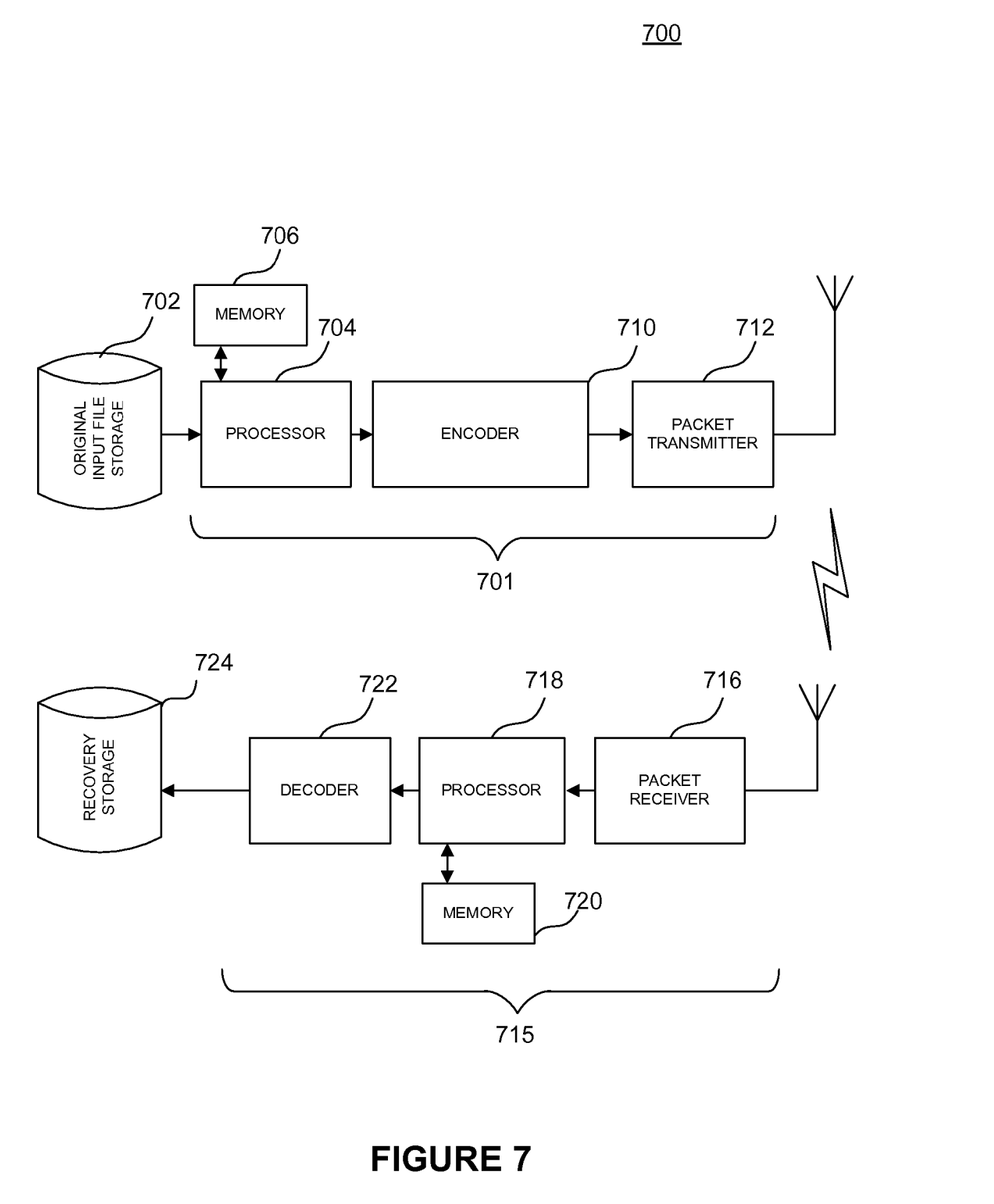
FIG. 7 depicts an exemplary embodiment of a communication scheme 700 in accordance with the present invention.

FIG. 7 depicts an exemplary embodiment of a communication scheme 700 in accordance with the present invention. A transmitter component 701 encodes a source file and transmits the encoded data to a receiver component 715. As shown in FIG. 7, transmitter component 701 includes a processor 704, a memory 706, an encoder 710 and a packet transmitter 712. Transmitter component 702 receives data from a storage unit 702 in the form of an input file. The input file is fed to a processor 704 which packetizes the input file. Particularly, processor 704 divides the source file into source packets and divides the source packets into groups. Memory 706 stores a source packet matrix including the source packets in one of the groups. Encoder 710 generates Forward Error Correction (FEC) packets for each column of the source packet matrix and FEC packets for each row of the source packet matrix as described above with respect to generating compound FEC. Packet transmitter 708 then transmits the source packet in the source packet matrix and the FEC packets for each row and column of the source packet matrix.

Receiver component 715 reconstructs a source file. As shown in FIG. 7, receiver component 715 includes a packet receiver 716, a memory 720, a processor 718, and a decoder 722. Packet receiver 716 receives packets, where each packet is either a source packet or an FEC packet. Memory 720 stores each source packet into a corresponding source packet matrix and stores each FEC packet. Processor 718 determines, for each row of the source packet matrix, whether at least one of the source packets has not been received and can be recovered based, in part, on a status information field of the row. Decoder 722 recovers a source packet that has not been received for each row, where the processor updates a status information field of a column associated with the recovered packet. Processor 718 also determines, for each column of the source packet matrix, whether at least one of the source packets has not been received and can be recovered based, in part, on a status information field of the column. Decoder 722 recovers a source packet that has not been received for each column and processor 718 updates a status information field of a row associated with the recovered packet. The operations described above can be performed on a file to reconstruct the original input file, which is stored in recovery storage 724.

In an optional embodiment, each source packet can be stored in a corresponding source packet matrix in recovery storage 724 (i.e., recovery storage 724 replaces memory 720). Similarly, each FEC packet can be stored on recovery storage 724 without first being processed in memory 720.

Braided FEC

In one example aspect of the present invention provides higher reliability for broadcasting using an FEC algorithm referred to herein as a braided FEC. The braided FEC can be implemented in a system for content delivery of files of any size using a combination of packet-level FEC on source data packets which are arranged in a matrix form, where encoding is done on all rows, columns and diagonals.

In one example embodiment, a file is divided into packets, where each packet has the same number of bytes, except for the last packet which may have fewer bytes. If the last packet has fewer bytes than the other packets, then stuff bytes (e.g., consisting of 0's) are added to the last packet to increase its size such that it has the same number of bytes (i.e., is the same size) as the other packets.

The resulting packets are arranged into mutually disjoint groups of packets. Different groups may have different number of packets. Stuff packets (e.g., consisting of 0's) also may be added to a group to increase its packet count.

The following example embodiments are described in terms of a single group of packets. However, as with the compound FEC technique described above, it should be understood that other groups of packets are treated the same way.

Figure 3:
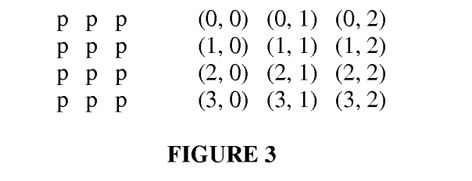
FIGS. 3-6 depict an exemplary procedure for encoding data using braided FEC in accordance with an embodiment of the present invention.

FIGS. 3-6 depict an exemplary procedure for encoding data using braided FEC in accordance with an embodiment of the present invention. In this example, given a file with 12 (4×3) packets, a 4×3 source packets (p) matrix is created by placing the first packet in the file into matrix position (0, 0), placing the second packet into position (0, 1), and so on until the $3^{rd}$ packet in the file is placed into position (0, 2). Then, the $4^{th}$ packet is placed into position (1, 0), and so on until the $6^{th}$ packet is placed into position (1, 2). This procedure continues until all 12 source packets in the file are placed into the matrix. The result will be a 4 by 3 source packets matrix as shown in FIG. 3.

Figure 4:
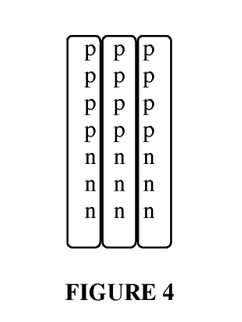
Figure 5:
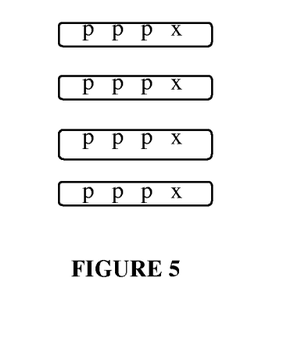
Figure 6:
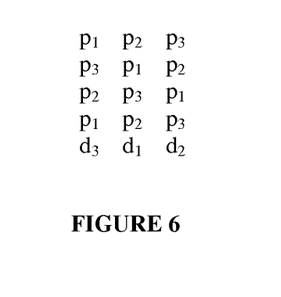

Referring to FIG. 4, three FEC packets (n) for each column's 4 source packets (i.e., the vertical boxes) are generated. Next, with reference to FIG. 5, one XOR FEC packet (x) for each row's 3 source packets (i.e., the horizontal boxes) is calculated. One XOR FEC packet (d) for each diagonal's 4 source packets are then calculated as shown in FIG. 6 (i.e., the $p_s$ with the same subscript form a diagonal, and d with the same subscript is the corresponding XOR FEC packet).

The resulting packets ($p_s$, $n_s$, $x_s$, $d_s$) are then transmitted until all source packets and FEC packets have been transmitted. Add corresponding header info (sequence number and other information about the packet) in each packet when transmitting the packets.

In an example embodiment, a group has (R×S) packets, where R and S are positive integers. These packets are arranged into an R×S matrix form and the (R×S) packets are referred to as source packets. Each source packet is associated with a coordinate, such as coordinate (i, j), where the source packet is in $i^{th}$ row and $j^{th}$ column and $0<=i<=(R-1)$, $0<=j<=(S-1)$.

In addition, for a pair of integers x and y, where y is positive, a unique integer z is defined as:

$$z = x \% y \qquad (3)$$

such that z is between 0 and (y−1) and (x−z) is multiple of y.

For an integer u set between 0 and (R−1), the following S source packets form a row of the source packets matrix, called the $u^{th}$ row:

$$(u,v), \text{ where } v \text{ is running from 0 to (S−1)}. \quad (4)$$

When u changes from 0 to (R−1), R rows of source packets are formed.

For an integer v set between 0 and (S−1), the following R source packets form a column of the source packets matrix, called the $v^{th}$ column:

$$(u,v), \text{ where } u \text{ is running from 0 to (R−1)}. \quad (5)$$

When v changes from 0 to (S−1), S columns of source packets are formed.

For an integer k between 0 to (S−1), the following R source packets form a diagonal of the source packets matrix, called the $k^{th}$ diagonal:

$$(u,(u+k)\%S), \text{ where } u \text{ is running from 0 to (R−1)}. \quad (6)$$

When k changes from 0 to (S−1), S diagonals of source packets are formed.

For source packets in each column of the matrix, K FEC packets are generated for some positive integer K and such that for each column, any R packets of the (R+K) packets (i.e., R source packets in that column plus K generated FEC packets for that column) will solve for the R source packets in that column. Similarly, for source packets in each row of the matrix, L FEC packets are generated for some positive integer L and such that for each row, any S packets of these (S+L) packets (i.e., S source packets in that row plus L generated FEC packets for that row) will solve for the S source packets in that row. Similarly, for source packets in each diagonal of the matrix, M FEC packets are generated for some positive integer M and such that for each diagonal, any S packets of these (S+M) packets (i.e., S source packets in that diagonal plus M generated FEC packets for that diagonal) will solve for the S source packets in that diagonal.

As with the compound FEC technique described above, K FEC packets are generated for the R source packets in each column, where R+K<=256. The numbers 0, 1, . . . , 255 (where each being represented by a 8-bit byte) form a Galois Field GF(256) under the bitwise XOR operation and multiplication defined by an irreducible degree 8 polynomial over GF(2).

x$y means x to the power of y in this GF(256) and the following Vandermonde matrix is an R×(R+K) matrix:

| 1 | 1 | 1 | ... | 1 |
|---|---|---|---|---|
| 0 | 1 | 2 | ... | (R + K − 1) |
| 0$2 | 1$2 | 2$2 | ... | (R + K − 1)$2 |
| ... | | | | |
| 0$(R − 1) | 1$(R − 1) | 2$(R − 1) | ... | (R + K − 1)$(R − 1) |

This Vandermonde matrix has the property that any of its R×R sub-matrices is invertible. Now, using only matrix row operations, the above matrix can be changed to $$I\,G \quad (7)$$

where I is the R×R identity matrix, and G is R×K matrix, such that an R×(R+K) matrix [I G] still has the property that any of its R×R sub-matrices are invertible. Assuming the size of each source packet is B bytes, then every packet can be defined as a vector of B elements in GF(256). The R source packets in a column can be defined as R vectors, which can further be defined as an R×B matrix, denoted as matrix H. Then $$G^T * H \quad (8)$$

is a K×B matrix, where $G^T$ is the transpose matrix of G. The resulting K×B matrix consists of K vectors, each vector having B bytes. These K vectors are the K generated FEC packets and are the same size as the source packets. From the property of [I G], the R source packets can be solved from any R of the (R+K) packets (i.e., R source packets plus K FEC packets).

The generation of L FEC packets for the S source packets in each row is similar to the generation of the above K FEC packets. The generation of M FEC packets for the S source packets in each diagonal is similar as well. The source packets together with the generated K, L and M FEC packets are then transmitted from one computer to other computers.

Header information, such as sequence number and other info about the packet is added to each packet upon transmission of these packets.

Some packets may get lost during the transmissions due to impairments which degrade the signal quality. One aspect of the present invention provides an algorithm runs on the receiving devices (e.g., computers) to recover lost source packets from the received packets. This recovery procedure is performed on a group by group basis. An exemplary implementation is described below in terms of pseudo code.

As described above, FIG. 7 includes a transmitter component 701 which encodes a source file and transmits the encoded data to a receiver component 715. In the braided FEC embodiment, processor 704 divides the source file into source packets and divides the source packets into groups. Memory 706 stores a source packet matrix including the source packets in one of the groups. Encoder 710 then generates Forward Error Correction (FEC) packets for each column of the source packet matrix, FEC packets for each row of the source packet matrix, and FEC packets for each diagonal of the source packet matrix. Packet transmitter 712 then transmits the source packet in the source packet matrix and the FEC packets for each row, column and diagonal of the source packet matrix.

At the receiver side, receiver component 715 reconstructs a source file that has been encoded using braided FEC. Particularly, packet receiver 716 receives packets, where each packet is either a source packet or an FEC packet. Memory 720 stores each source packet into a corresponding source packet matrix and each FEC packet. Processor 718 determines, for each row of the source packet matrix, whether at least one of the source packets has not been received and can be recovered based, in part, on a status information field of the row.

Decoder 722 recovers a source packet that has not been received for each row, and processor 718 updates a status information field of a column and a diagonal associated with the recovered packet. Processor 718 also determines, for each column of the source packet matrix, whether at least one of the source packets has not been received and can be recovered based, in part, on a status information field of the column. Decoder 722, in turn, also recovers a source packet that has not been received for each column and processor 718 updates a status information field of a row and a diagonal associated with the recovered packet.

Processor 718 also determines, for each diagonal of the source packet matrix, whether at least one of the source packets has not been received and can be recovered based, in part, on a status information field of the diagonal. In turn, decoder 722 also recovers a source packet that has not been received for each diagonal and processor 718 updates a status information field of a row and a column associated with the recovered packet.

As with compound FEC technique described above, the operations described above can be performed in-place on a file to reconstruct the original input file, which is stored in recovery storage 724.

As in the compound FEC embodiment described above, in an optional embodiment, each source packet can be stored in a corresponding source packet matrix in recovery storage 724 (i.e., recovery storage 724 replaces memory 720). Similarly, each FEC packet can be stored on recovery storage 724 without first being processed in memory 720.

In the pseudo code that follows:

"N" is defined as a two dimensional vector, where N[i][j] is 0 if the source packet in the $i^{th}$ row and $j^{th}$ column is received and 1 if the corresponding source packet is missing;

"U" is an "R" elements vector where U's $i^{th}$ element has variable "m" to denote the total missing source packets in the $i^{th}$ row, and variable "t" to denote the total number of packets (i.e., source packets and the FEC packets for the $i^{th}$ row) received in the $i^{th}$ row;

"V" is an "S" elements vector where V's $j^{th}$ element has variable "m" to denote the total missing source packets in the $j^{th}$ column, and variable "t" to denote the total number of packets (i.e., source packets and the FEC packets for the $j^{th}$ column) received in the $j^{th}$ column; and "W" is an "S" elements vector where W's $k^{th}$ element has variable "m" to denote the total missing source packets in the $k^{th}$ diagonal, and variable "t" to denote the total number of packets (source packets and the FEC packets for the $k^{th}$ diagonal) received in the $k^{th}$ diagonal.

"Missing" is a variable to denote the total number of missing source packets in the (R×S) source packets.

The recovery algorithm is as follows. It should be understood that this example processes one group. However, other groups are treated the same way.

```
int flag;
flag = 1;
while (flag)
{
    flag = 0;
    //processing rows
    for (i=0; i<R; i++)
    {
        if (U[i].m == 0) //this row is skipped
            continue;
        if (U[i].t < S)
            continue;
        //Since this row has received at least S packets
        solve the missing source packet in this row;
        flag = 1;
        Missing -= U[i].m;
        U[i].m = 0; //next time, this row will be skipped
        for (j=0; j<S; j++)
        {
            if (N[i][j] ==1)
            {
                N[i][j] = 0;
                V[j].m--; //update column status information
                V[j].t++; //update column status information
                W[(j-i)%S].m--; //update diagonal status information
                W[(j-i)%S].t++; //update diagonal status information
            }
        }
    }
    //processing columns
    for (j=0; j<S; j++)
    {
```

```
        if (V[j].m == 0) //this column is skipped
            continue;
        if (V[j].t < R)
            continue;
        //Since this column has received at least R packets
        solve the missing source packet in this column;
        flag = 1;
        Missing -= V[j].m;
        V[j].m = 0; //next time, this column will be skipped
        for (i=0; i<R; i++)
        {
            if (N[i][j] == 1)
            {
                N[i][j] = 0;
                U[i].m--; //update row status information
                U[i].t++; //update row status information
                W[(j-i)%S].m--; //update diagonal status information
                W[(j-i)%S].t++; //update diagonal status information
            }
        }
    }
    //processing diagonals
    for (q=0; q<S; q++)
    {
        if (W[q].m == 0) //this diagonal is skipped
            continue;
        if (W[q].t < R)
            continue;
        //Since this diagonal has received at least R packets
        solve the missing source packet in this diagonal;
        flag = 1;
        Missing -= W[q].m;
        W[q].m = 0; //next time, this diagonal will be skipped
        for (p=0; p<R; p++)
        {
            int c;
            c = (p+q)%S;
            if (N[p][c] == 1)
            {
                N[p][c] = 0;
                U[p].m--; //update row status information
                U[p].t++; //update row status information
                V[c].m--; //update column status information
                V[c].t++; //update column status information
            }
        }
    }
}
if (Missing == 0)
    all the missing source packets in this group are recovered
else
    some missing source packets cannot be recovered by this
    decoding method
```

Under certain conditions, some missing source packets may not be capable of being recovered by processing the received packets using the above decoding algorithm. Other data recovery techniques can be used in addition to the above algorithm, however, to recover the remaining lost packets based on certain run-time information and user configurations.

In an example embodiment, the recovery technique uses the Gaussian elimination method to recover lost packets, using linear equations with unknowns. FEC packets can be represented as linear equations, where the source packets to be recovered are the unknowns.

The FEC packets generated in each row or column or diagonal also can be generated by other FEC methods, for example the LDPC (Low Density Parity Check) method. In an example embodiment, the corresponding decoding method is a modified version of the above iterative decoding method.

Additional groups of diagonal source packets also may be defined and used to generate new FEC packets. For example, for an integer number e, where e is co-prime with S, the following R packets form a diagonal of R source packets:

(u,(u+e*k)%S), where u is running from 0 to (R−1).    (9)

When k varies from 0 to (S−1), a group of S diagonals is formed. When e varies between 1 to (S−1), where e is again co-prime to S, several groups of diagonals are formed. These different groups of diagonals can be used to add new FEC packets or be used in retransmission of missing packets.

Another example of diagonals can be defined as following. For an integer number e, where e is co-prime with S, the following R packets form a diagonal of R source packets:

(u,(−u+e*k)%S), where u is running from 0 to (R−1).    (9)

When k varies from 0 to (S−1), a group of S diagonals is formed. When e varies between 1 to (S−1), where e is again co-prime to S, several groups of diagonals are formed.

The above braided FEC algorithm can be extended to an n-dimensional cube, where for each direction that is parallel to some edge of the cube, some FEC packets are generated by source packets in that direction similar to the two dimensional source packets matrix case discussed above. There can be several different diagonal directions of which some or all may be used. For each diagonal direction, some FEC packets are generated by source packets in that diagonal direction similar to a two dimensional source packets matrix case discussed above.

For an exemplary file having 16,129 (127*127) packets, the arrangement of these 16,129 source packets forms a 127 by 127 source packets matrix. Each row has 127 packets which are consecutive packets in the file. In addition, each column and each diagonal also have 127 packets. For each row, 1 XOR FEC packet is generated by XOR'ing all source packets in that row; for each column, 1 XOR FEC packet is generated by XOR'ing all source packets in that column; and for each diagonal, 1 XOR FEC packet is generated by XOR'ing all the source packets in that diagonal. These 381 FEC packets (i.e., 127 for rows, 127 for columns, 127 for diagonals) together with the 16,129 source packets are transmitted for this file delivery. In this example, the FEC rate is 381/(16,129+381)=2.31%.

In this document, the terms "computer program medium" and "computer usable medium" are used to generally refer to media such as removable storage drive, a hard disk installed in hard disk drive. These computer program products provide software to computer system.

Computer programs (also referred to as computer control logic) are stored in memory. Computer programs may also be received via a communications interface. Such computer programs, when executed, enable the computer system to perform the features of the present invention, as discussed herein. In particular, the computer programs, when executed, enable a processor to perform the features of the present invention. Accordingly, such computer programs represent controllers of the computer system.

In another embodiment, the invention is implemented primarily in hardware using, for example, hardware components such as application specific integrated circuits (ASICs). Implementation of the hardware state machine so as to perform the functions described herein will be apparent to persons skilled in the relevant art(s).

In yet another embodiment, the invention is implemented using a combination of both hardware and software.

While various example embodiments of the present invention have been described above, it should be understood that they have been presented by way of example, and not limitation. It will be apparent to persons skilled in the relevant art(s) that various changes in form and detail can be made therein.

Thus, the present invention should not be limited by any of the above described example embodiments, but should be defined only in accordance with the following claims and their equivalents.

In addition, it should be understood that the FIGS. 1-7 and the pseudo code presented herein are presented for example purposes only. The architecture of the example embodiments presented herein is sufficiently flexible and configurable, such that it may be utilized in ways other than that shown in the accompanying figures and pseudo code.

Further, the purpose of the foregoing Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the example embodiments presented herein in any way. It is also to be understood that the procedures recited in the claims need not be performed in the order presented.

What is claimed is:

1. A method for encoding a source file to be transmitted to a receiver, comprising the steps of:
    dividing the source file into a plurality of source packets;
    dividing the plurality of source packets into a plurality of groups;
    generating a source packet matrix from the plurality of source packets in one of the plurality of groups;
    calculating a plurality of Forward Error Correction (FEC) packets for each column of the source packet matrix;
    calculating a plurality of FEC packets for each row of the source packet matrix;
    calculating a plurality of FEC packets for each diagonal of the source packet matrix; and
    transmitting the source packets in the source packet matrix and the plurality of FEC packets for each row, column and diagonal of the source packet matrix.

2. The method of claim 1, wherein transmitting further comprises,
    adding corresponding header information to each packet; and
    wherein the transmitting further includes transmitting the plurality of rows of the source packet matrix until all of the rows have been transmitted.

3. A computer-readable medium having stored thereon sequences of instructions, the sequences of instructions including instructions which when executed by a computer system cause the computer system to perform:
    dividing a source file into a plurality of source packets;
    dividing the plurality of source packets into a plurality of groups;
    generating a source packet matrix from the plurality of source packets in one of the plurality of groups;
    calculating a plurality of Forward Error Correction (FEC) packets for each column of the source packet matrix;
    calculating a plurality of FEC packets for each row of the source packet matrix;
    calculating a plurality of FEC packets for each diagonal of the source packet matrix; and
    transmitting the source packets in the source packet matrix and the plurality of FEC packets for each row, column and diagonal of the source packet matrix.

4. The computer-readable medium according to claim 3, further having stored thereon sequences of instructions which when executed by a computer system cause the computer system to perform:
    adding corresponding header information to each packet; and
    wherein the transmitting further includes transmitting the plurality of rows of the source packet matrix until all of the rows have been transmitted.

5. An apparatus for encoding a source file to be transmitted to a receiver, comprising:
- a processor configured to divide the source file into a plurality of source packets and divide the plurality of source packets into a plurality of groups;
- a memory configured to store a source packet matrix including the plurality of source packets in one of the plurality of groups;
- an encoder configured to generate a plurality of Forward Error Correction (FEC) packets for each column of the source packet matrix, a plurality of FEC packets for each row of the source packet matrix, and a plurality of FEC packets for each diagonal of the source packet matrix; and
- a transmitter configured to transmit the source packet in the source packet matrix and the plurality of FEC packets for each row, column and diagonal of the source packet matrix.

6. The apparatus according to claim 5, wherein the transmitter is further configured to:
- add corresponding header information to each packet; and
- transmit the plurality of rows of the source packet matrix until all of the rows have been transmitted.

\* \* \* \* \*

UNITED STATES PATENT AND TRADEMARK OFFICE
CERTIFICATE OF CORRECTION

| | | |
|---|---|---|
| PATENT NO. | : 8,418,034 B2 | Page 1 of 1 |
| APPLICATION NO. | : 12/365372 | |
| DATED | : April 9, 2013 | |
| INVENTOR(S) | : Weimin Fang | |

It is certified that error appears in the above-identified patent and that said Letters Patent is hereby corrected as shown below:

In the Specification:

COLUMN 8:

Line 22, "disjoint" should read --disjointed--.

COLUMN 9:

Line 43, "a 8-bit" should read --an 8-bit--.

COLUMN 10:

Line 23, "provides an algorithm runs" should read --provides an algorithm that runs--.

COLUMN 11:

Line 15, "two dimensional" should read --two-dimensional--.

Signed and Sealed this
Twenty-ninth Day of April, 2014

Michelle K. Lee
*Deputy Director of the United States Patent and Trademark Office*